(12) United States Patent
Topacio

(10) Patent No.: US 7,790,501 B2
(45) Date of Patent: Sep. 7, 2010

(54) SEMICONDUCTOR CHIP PASSIVATION STRUCTURES AND METHODS OF MAKING THE SAME

(75) Inventor: Roden R. Topacio, Markham (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 12/167,108

(22) Filed: Jul. 2, 2008

(65) Prior Publication Data

US 2010/0001399 A1 Jan. 7, 2010

(51) Int. Cl.
*H01L 23/488* (2006.01)
*H01L 21/60* (2006.01)

(52) U.S. Cl. .................. 438/106; 438/118; 257/737; 257/E23.01; 257/E21.511

(58) Field of Classification Search .............. 257/737, 257/750, 774, E23.023, E23.01, E21.506, 257/E21.511; 438/106, 118, 613, 614, 629
See application file for complete search history.

(56) References Cited

U.S. PATENT DOCUMENTS

2009/0032941 A1* 2/2009 McLellan et al. ........... 257/737

OTHER PUBLICATIONS

Guotao Wang et. al.; *Chip-packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.
John Baliga; *Yet Another Way to Use BCB*; Semiconductor International; http://www.semiconductor.net/article/CA6347341.html; Jul. 1, 2006; pp. 1-3.
Stanley Wolf and Richard N. Tauber; *Silicon Processing for the VLSI Era, vol. 2—Process Integration*; pp. 273-276 and 337; 1990.

* cited by examiner

*Primary Examiner*—Victor A Mandala
*Assistant Examiner*—Whitney Moore
(74) *Attorney, Agent, or Firm*—Timothy M. Honeycutt

(57) ABSTRACT

Various semiconductor chip passivation structures and methods of making the same are disclosed. In one aspect, a method of manufacturing is provided that includes applying a polymeric passivation layer to a side of a semiconductor chip. The side of the semiconductor chip includes plural conductor pads. Plural openings are formed in the polymeric passivation layer to expose the plural conductor pads. Plural conductor structures are formed on the plural conductor pads.

16 Claims, 4 Drawing Sheets

SEMICONDUCTOR CHIP PASSIVATION STRUCTURES AND METHODS OF MAKING THE SAME

BACKGROUND OF THE INVENTION

1. Field of the Invention

This invention relates generally to semiconductor processing, and more particularly to semiconductor chip passivation structures and methods of making the same.

2. Description of the Related Art

A conventional semiconductor chip destined for flip-chip mounting to a printed circuit board or semiconductor package substrate will typically consist of two principle sides: one side provided with a plurality of input/output conductors, and an opposite side that may or may not be fitted with a heat spreader. This general configuration holds true whether the chip is implemented as a bulk silicon or semiconductor device or a semiconductor-on-insulator device. The principle side of the semiconductor chip that is provided with the input/output conductor pads typically includes one or more metallization layers that are formed above the active device portion of the chip and an array of conductor pads connected to the metallization layers by vias. The top-most metallization layer includes the array of conductor pads and is sometimes referred to as a redistribution layer. The conductors pads are provided with under bump metallization (UBM) structures suitable to provide metal diffusion resistant surfaces for solder bump placement.

In a C4 flip-chip interconnect process, a plurality of solder bumps are applied to the bump pads and a corresponding plurality of solder bumps are formed on respective conductor pads on a package substrate or printed circuit board. The respective collections of bumps are brought together and a reflow process is performed in order to establish a plurality of solder joints between the semiconductor chip and the printed circuit board or package substrate. It is important to protect the top-most metallization layer from contamination and physical damage prior to bumping and assembly with a substrate. A damaged or contaminated bump pad might lead to device failure. In a conventional process, this protective function is provided by a passivation structure that is applied to the side of the semiconductor chip that includes the bump pads. The passivation structure undergoes a masking and etch process to expose the conductor pads. A polyimide layer is often applied over the passivation layer, including over the previously etched openings to the conductor pads, to provide protection from thermomechanical stresses that might otherwise damage chip structures. Thereafter, the polyimide layer is lithographically processed to essentially reestablish openings leading to the underlying bump pads, and then metal deposition processes and solder application processes are used in order to establish the under bump metallization and solder bumps.

In one conventional process, a passivation structure consists of a six layer stack of alternating layers of silicon nitride and undoped silicate glass. Processing at this stage is done at the wafer level, so application of each of the silicon nitride and undoped silicate glass layers requires the wafer to be moved in and out of a chemical vapor deposition (CVD) chamber and subjected to CVD in order to establish a given layer. Consequently, a dozen or more material movements and steps will be required in order to establish a conventional six layer passivation stack as well as the six deposition processes themselves. The number of both material handling and CVD processes represents an investment of manufacturing time and materials.

In some conventional processes, the steps of passivation structure formation and polyimide layer application are divided between different, and often geographically separated, manufacturing facilities. For example, it is not uncommon for one vendor to manufacture the semiconductor chip up to and including the passivation structure. At this point, the wafer is shipped to a bumping vendor that applies the polyimide layer and then performs the subsequent lithographic processing to form the UBM structures and solder bumps. Thus, the passivation structure is formed by one vendor and the polyimide and under bump metallization are formed subsequently by another vendor.

The present invention is directed to improving upon the aforementioned conventional techniques.

SUMMARY OF THE INVENTION

In accordance with one aspect of the present invention, a method of manufacturing is provided that includes applying a polymeric passivation layer to a side of a semiconductor chip. The side of the semiconductor chip includes plural conductor pads. Plural openings are formed in the polymeric passivation layer to expose the plural conductor pads. Plural conductor structures are formed on the plural conductor pads.

In accordance with another aspect of the present invention, a method of manufacturing is provided that includes forming plural conductor pads on a side of a semiconductor chip and applying a polymeric passivation layer to the side of a semiconductor chip to cover the plural conductor pads. Plural openings are formed in the polymeric passivation layer to expose the plural conductor pads. The side of the semiconductor chip is coupled to a printed circuit. Plural electrical interconnects are established between the semiconductor chip and the printed circuit board.

In accordance with another aspect of the present invention, an apparatus is provided that includes a semiconductor chip that has a side that includes plural conductor pads. A polymeric passivation layer is coupled to the side of the semiconductor chip. The polymeric passivation layer has plural openings to the plural conductor pads. Plural conductor structures are coupled to the side of the semiconductor chip. Each of the plural conductor structures has a portion positioned in one of the plural openings and coupled to one of the conductor pads.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
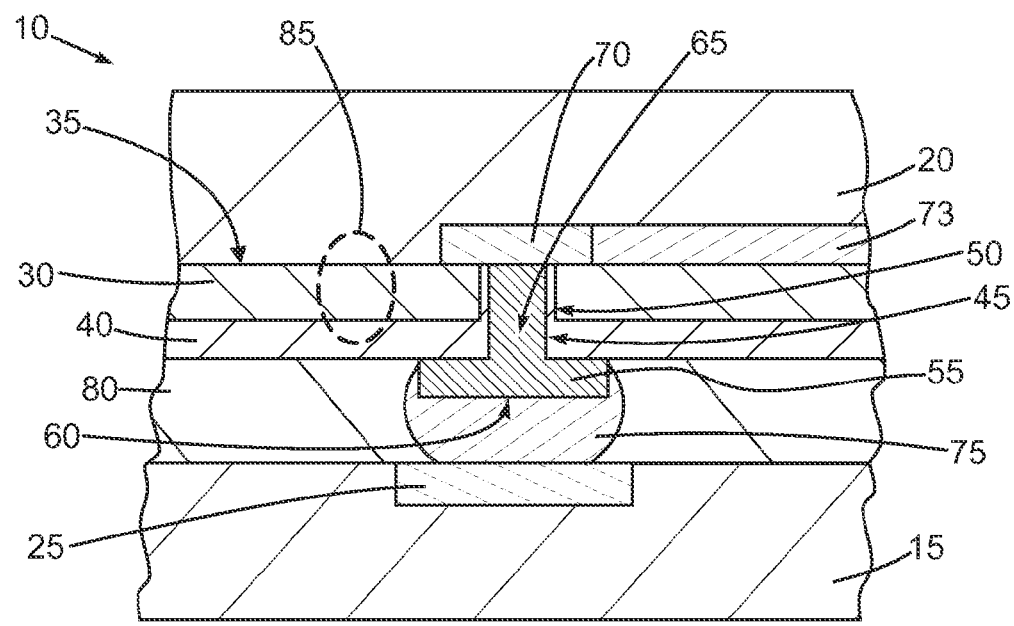
FIG. 1 is a sectional view of a small portion of an exemplary conventional semiconductor chip package.

In the drawings described below, reference numerals are generally repeated where identical elements appear in more than one figure. Turning now to the drawings, and in particular to FIG. 1, therein is shown a sectional view of a small portion of an exemplary conventional semiconductor chip package 10 that includes a package substrate 15 upon which a semiconductor chip or die 20 is flip-chip mounted. The substrate 15 is composed of a series of polymer layers built up and interspersed with conductor traces and vias that are not visible. The substrate 15 includes a plurality of conductor pads, one of which is shown and labeled 25. The conductor pad(s) 25 may be interconnected to the aforementioned vias and traces. A typical conventional substrate 15 includes scores or hundreds of such conductor pads 25.

A passivation structure 30 is formed on a surface 35 of the semiconductor chip 20 and, as described in more detail below, consists of a laminate of several alternating layers of dielectric material. A polyimide layer 40 is formed on the passivation structure 30. Openings are formed in the polyimide layer 40 and the passivation structure 30 at 45 and 50, respectively, so that an under bump metallization (UBM) structure 55 may be formed with a bonding surface 60 that extends laterally on the polyimide layer 40 and another bonding surface 65 that extends to and metallurgically bonds with a conductor or bump pad 70 of the semiconductor chip 20. The bump pad 70 may be one of scores or hundreds of such bump pads that are formed on or near the surface 35 of the semiconductor chip 20. There may be plural interconnect structures that connect to the bump pad 70 and other similar bump pads that are not visible. One of the interconnect structures is shown connected to the bump pad 70 and labeled 73. The different cross-hatchings of the interconnect structure 73 a and the bump pad 70 implies that the two structures are physically distinct, but connected structures. However, it should be understood that the bump pad 70 and the interconnect structure 73 may be contiguous. A conductive metallurgical connection between the pad 25 of the package substrate 15 and the UBM 55 of the semiconductor chip 20 is established by way of a solder joint 75 that consists of corresponding portions of solder coupled to the UBM 55 and the pad 25 that are merged metallurgically during a reflow process.

An underfill material layer 80 is interposed between the polyimide layer 40 and the package substrate 15 in order to help alleviate differential stresses associated with differences in coefficient of thermal expansion between the substrate 15 and the semiconductor chip 20. The underfill 80 is typically composed of an epoxy with or without some form of fiberglass fill material.

The passivation structure 30 is designed to protect the top-most metallization, as exemplified by the bump pad 70 and the interconnect structure 73 shown in FIG. 1, prior to bumping. In a typical conventional process, the bumping process entails forming the opening in the passivation structure 30 at 50 by appropriate masking and etching, applying the polyimide layer 40, forming the opening in the polyimide layer 40 by appropriate masking and etching, and metal deposition and etch definition to define the UBM 55, and application of a portion of solder to the UBM 55 that will eventually form a substantial fraction of the solder joint 75. The polyimide layer 40 is designed to protect the semiconductor chip 20 from thermal mechanical stresses that will arise after flip-chip mounting to the substrate 15 as shown in FIG. 1. The portion of the package 10 circumscribed by the dashed oval 85 will be shown at greater magnification in FIG. 2 to facilitate the description of further details of the conventional passivation structure 30.

Figure 2:
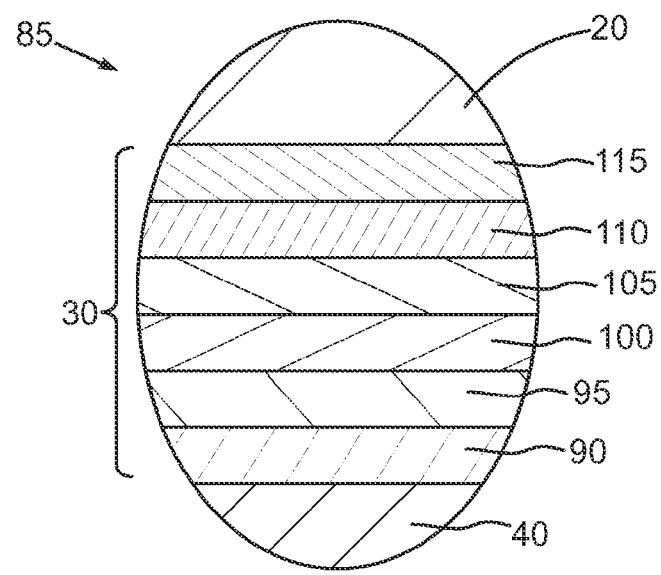
FIG. 2 is a portion of FIG. 1 shown at greater magnification.

Attention is now turned to FIG. 2. As is evident, the passivation structure 30 formed between the semiconductor chip 20 and the polyimide layer 40 consists of a stack of six layers 90, 95, 100, 105, 110 and 115. The layers 90, 100 and 110 consists of undoped silicate glass (USG) and the layers 95, 105 and 115 consist of silicon nitride. The silicon nitride and USG layers are alternatively applied in separate deposition processes that typically consist of a chemical vapor deposition (CVD) process for each. The drawback with the conventional passivation structure 30 is that with such a large number of individual layers 90, 95, 100, 105, 110 and 115, there is a penalty in terms of processing time and complexity in order to yield the passivation structure 30. Each of the layers 90, 95, 100, 105, 110 and 115 will typically require movement of a semiconductor workpiece or wafer into and out of a different CVD chamber with an attendant time associated with both workpiece movement and processing.

Figure 3:
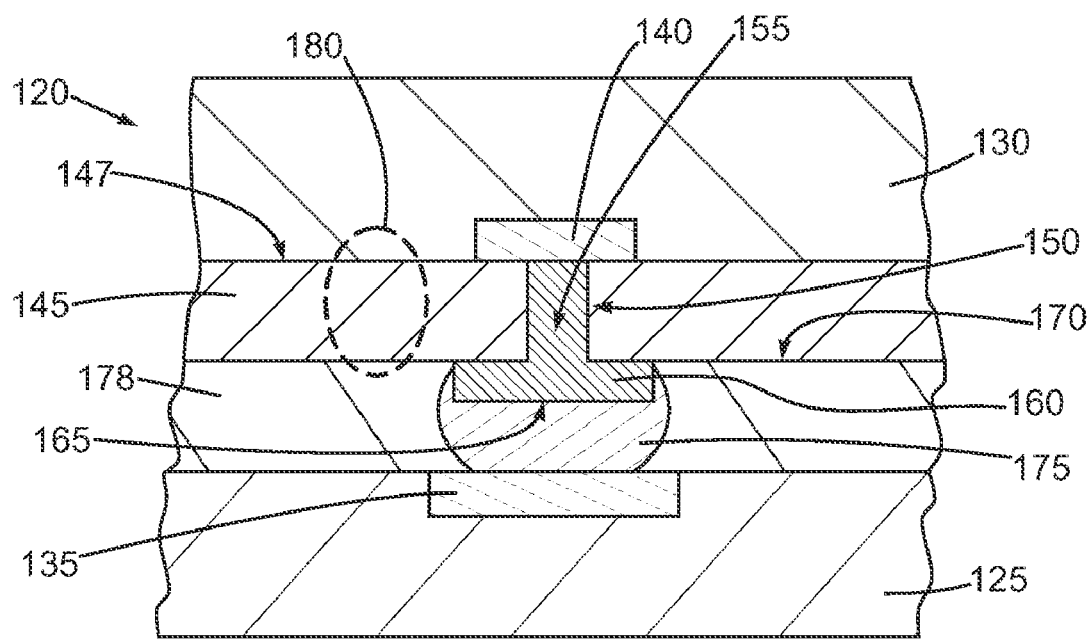
FIG. 3 is a sectional view of a small portion of an exemplary embodiment of a semiconductor chip package.

Attention is now turned to FIG. 3, which is a sectional view of a small portion of an exemplary embodiment of a semiconductor chip package 120 that includes a package substrate 125 upon which a semiconductor chip 130 is flip-chip mounted. The package 120 may be lidless as depicted or fitted with any type of lid or heat spreader (not shown) as desired. The substrate 125 may consist of a core/build-up configuration. In this regard, the substrate 125 may consist of a central core upon which one or more build-up layers are formed and below which an additional one or more build-up layers are formed. The core itself may consist of a stack of one or more layers. One example of such an arrangement may be termed a so called "2-4-2" arrangement where a four-layer core laminated between two sets of two build-up layers. The number of layers in the substrate 125 can vary from four to sixteen or more, although less than four may be used. So-called "coreless" designs may be used as well. The layers of the substrate 125 consist of an insulating material, such as various well-known epoxies, interspersed with metal interconnects. Optionally, the substrate 125 may be composed of well-known ceramics or other materials suitable for package substrate or printed circuit boards. To provide for electrical connectivity, the substrate 125 is provided with a plurality of conductor pads, one of which is shown and labeled 135, and that may be connected to other interconnect structures within the body of the substrate 125 that are not visible.

The semiconductor chip 130 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. To provide electrical connectivity with external devices, the semiconductor chip 130 may be provided with a plurality of input/output structures or conductor pads, one of which is shown and labeled 140, that provide interconnects to various conductor structures within the semiconductor chip 130 that are not visible. The conductor pad(s) 140 may be formed using well-known lithographic patterning and metal deposition and/or plating techniques.

In lieu of the laminate passivation structure 30 depicted in FIGS. 1 and 2, a polymeric passivation layer 145 may be applied to a side 147 of the semiconductor chip 130. In this illustrative embodiment, the polymeric passivation layer 145 may be monolithic and provide both a passivation function and a thermal mechanical stress protection function that would otherwise provided by the separate passivation structure 30 and the polyimide layer 40 in the conventional embodiment depicted in FIGS. 1 and 2. An opening is provided in the polymeric passivation layer 145 at 150 in order to provide access to the underlying conductor pad 140 for a portion 155 of a UBM layer 160. A bonding surface 165 of the UBM layer 160 projects over a portion of a surface 170 of the polymeric passivation layer 145. A variety of materials may be used for the UBM layer 160, such as copper, gold, silver, platinum, nickel, vanadium, aluminum, combinations of these or the like. In an exemplary embodiment, the UBM layer 160 may consist of a titanium layer on the bond pad 140, a nickel-vanadium layer on the titanium layer and a copper layer on the nickel-vanadium layer. The copper layer is designed to readily wet solder. A solder joint 175 is provided between the UBM structure 160 and the conductor pad 135 of the package substrate 125. The solder joint 175 may be composed of lead-based or lead-free solder as desired. Exemplary solders include tin-lead (63% Pb 37% Sn), tin-silver (about 97.3% Sn 2.7% Ag), tin-copper (about 99% Sn 1% Cu), tin-silver-copper (about 96.5% Sn 3% Ag 0.5% Cu) or the like. In an exemplary embodiment, the solder structure 175 consists of a reflowed combination of eutectic tin-lead solder composition (63% Pb 37% Sn) nearer the package substrate pad 150 and a higher lead content (97% Pb 3% Sn) portion proximate the UBM structure 160. Prior to mounting the semiconductor chip 130 on the substrate 125, a portion of high lead content solder may be fashioned into a bump on the conductor pad 140, and a bump of eutectic tin-lead solder may be formed on the conductor pad 135 of the substrate, both using well-known solder stenciling techniques. The two bumps may thereafter be joined in a reflow process to establish the joint 175. An underfill material 178 may be deposited between the substrate 125 and the semiconductor chip 130 to lessen the effects of differential CTE between the semiconductor chip 130 and the substrate 125. The underfill material 178 may be, for example, an epoxy resin mixed with silica fillers and phenol resins, and deposited using well-known capillary injection or other techniques.

Figure 4:
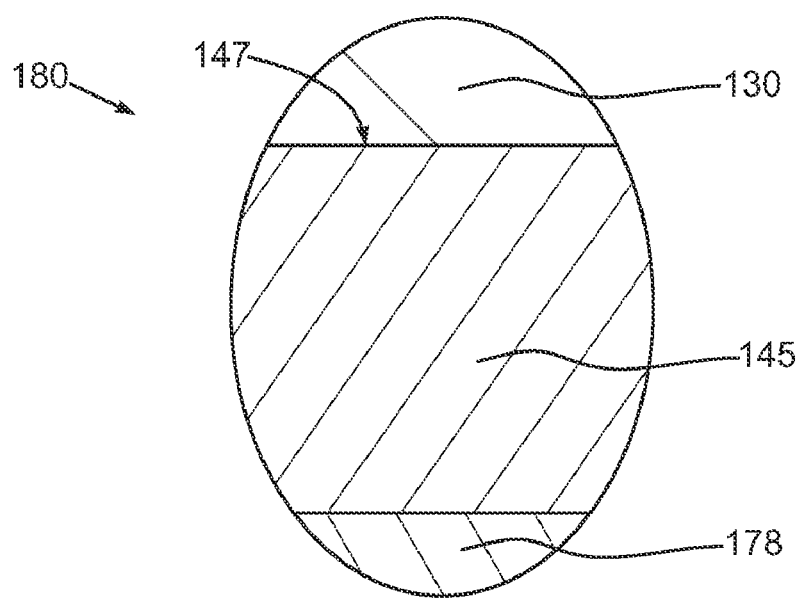
FIG. 4 is a portion of FIG. 3 shown at greater magnification.

A small portion of the package 120 is circumscribed by the dashed oval 180. The dashed oval 180 will be shown at much greater magnification in FIG. 4. Attention is now turned to FIG. 4. Note that a small portion of the semiconductor chip 130, a small portion of the under fill material layer 178 and the polymeric passivation layer 145 are visible in FIG. 4. As noted above, the polymeric passivation layer 145 may be applied to the surface 147 of the semiconductor chip 130 as a monolithic layer in a single deposition process if desired. Of course, the semiconductor chip 130 will not be coupled to the package substrate 125, and may be rotated by as much as 180° from the orientation depicted in FIG. 4, at the time the polymeric passivation layer 145 is applied. In an exemplary embodiment, the polymeric passivation layer 145 may consist of polyimide. Optionally, the polymeric passivation layer 145 may be composed of benzocyclobutene or like polymers, or other insulating materials such as silicon nitride or the like. Spin coating, CVD or other deposition processes may be used. If polyimide is selected, a heating step may be performed to cure the polymeric passivation layer 145. An appropriate thickness for the polymeric passivation layer 145 will depend on overall device size and geometry. In an exemplary embodiment, the polymeric passivation layer 145 may have a post-cure thickness of about 4.0 to 7.0 μm. Thus, the polymeric passivation layer 145 can be deposited in a single relatively straightforward processing step to yield a layer that serves both as passivation and as thermal mechanical cushioning and thus eliminates the need for the six separate deposition steps and dual etches that would be required to establish the multi-layer laminate passivation structure 30 depicted in FIGS. 1 and 2 and described elsewhere herein.

An appropriate opening in the polymeric passivation layer 145 is made at 150 to expose the conductor pad 140 using well-known lithographic patterning or other material removal techniques. Thereafter, the UBM layer 160 may be formed using CVD, physical vapor deposition or other material deposition techniques. The UBM 160 may be applied en masse on the semiconductor chip 130 and thereafter patterned lithographically.

Figure 5:
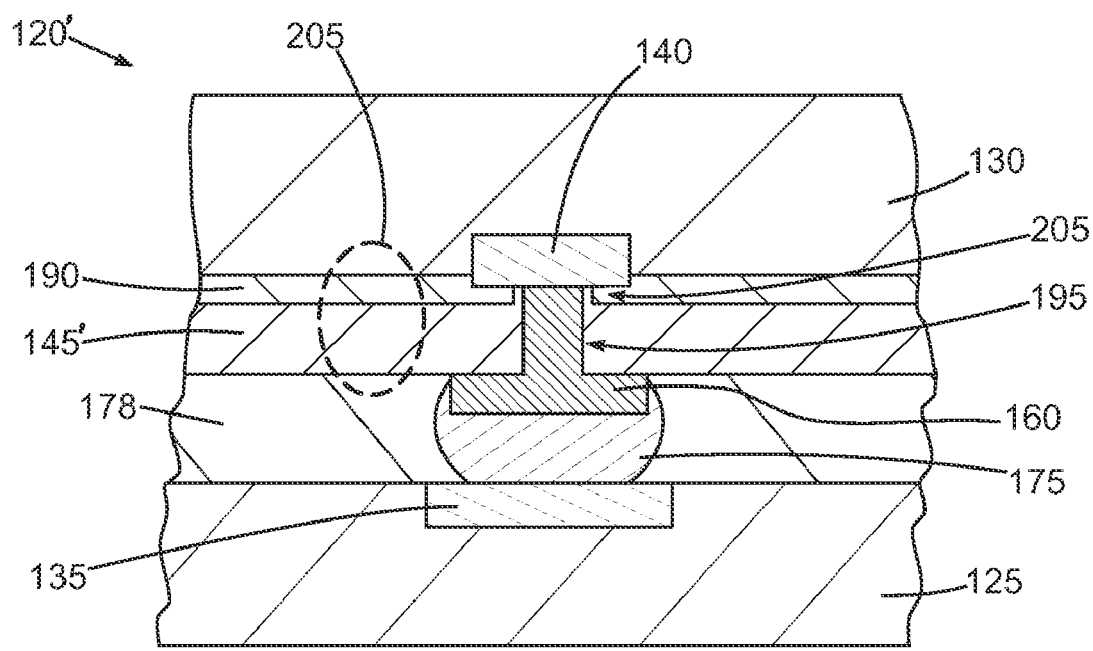
FIG. 5 is a sectional view of a small portion of an alternate exemplary embodiment of a semiconductor chip package.

An alternate exemplary embodiment of a semiconductor chip package 120' may be understood by referring now to FIG. 5, which is a sectional view like FIG. 3. In this illustrative embodiment, the package 120' may consist of the substrate 125, the semiconductor chip 130 mounted thereon as well as the conductor pad 135, the conductor pad 140, the UBM 160, the solder joint 175 and the underfill 178 all as generally described elsewhere herein. However, in this embodiment a passivation structure 190 may be formed on the semiconductor chip 130 and a polymeric passivation layer 145' may be formed on the passivation layer 190. To establish the UBM 160, openings may be formed in the polymeric layer 145' and the passivation layer 190 at 195 and 200 respectively using well-known lithographic patterning or other material removal techniques. A small portion of the package 120' is circumscribed by a dashed oval 205. The dashed oval 205 will be shown at greater magnification in FIG. 6.

Figure 6:
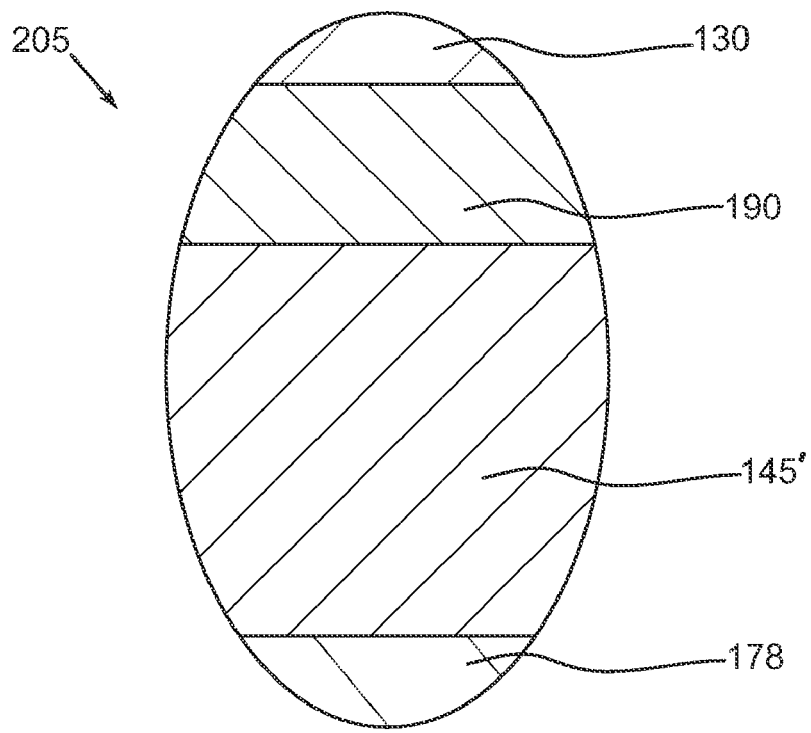
FIG. 6 is a portion of FIG. 5 shown at greater magnification.

Attention is now turned to FIG. 6, which as just noted, is the portion 205 of FIG. 5 shown at greater magnification. Note that a small portion of the semiconductor chip 130, a small portion of the under fill 178 and the films 190 and 145' are visible. Providing the passivation layer 190 between the polymeric passivation layer 145' and the underfill 178 may be useful in circumstances where the semiconductor chip 130 may be part of some larger workpiece such as a wafer that is processed up to the point where the conductor pad 140 depicted in FIG. 5 is ready to receive a UBM structure but such processing is destined to take place at another facility. In this way, the passivation layer 190 may be applied to protect the underlying conductor pad 140 during material movement to another location. At this point, the polymeric passivation layer 145' may be applied as a monolithic layer as shown and then the openings at 195 and 200 shown in FIG. 5 may be made in order to allow the UBM structure 160 to be formed. It should be understood however that the passivation layer 190 need not be a single layer but could perhaps instead be one or a small number of layers that are much less than the six layer laminate 30 depicted in FIGS. 1 and 2. In this way, a savings in terms of both material and time may be realized while still providing for an interim conductor pad protection prior to the application of the polymeric passivation layer 145'.

Figure 7:
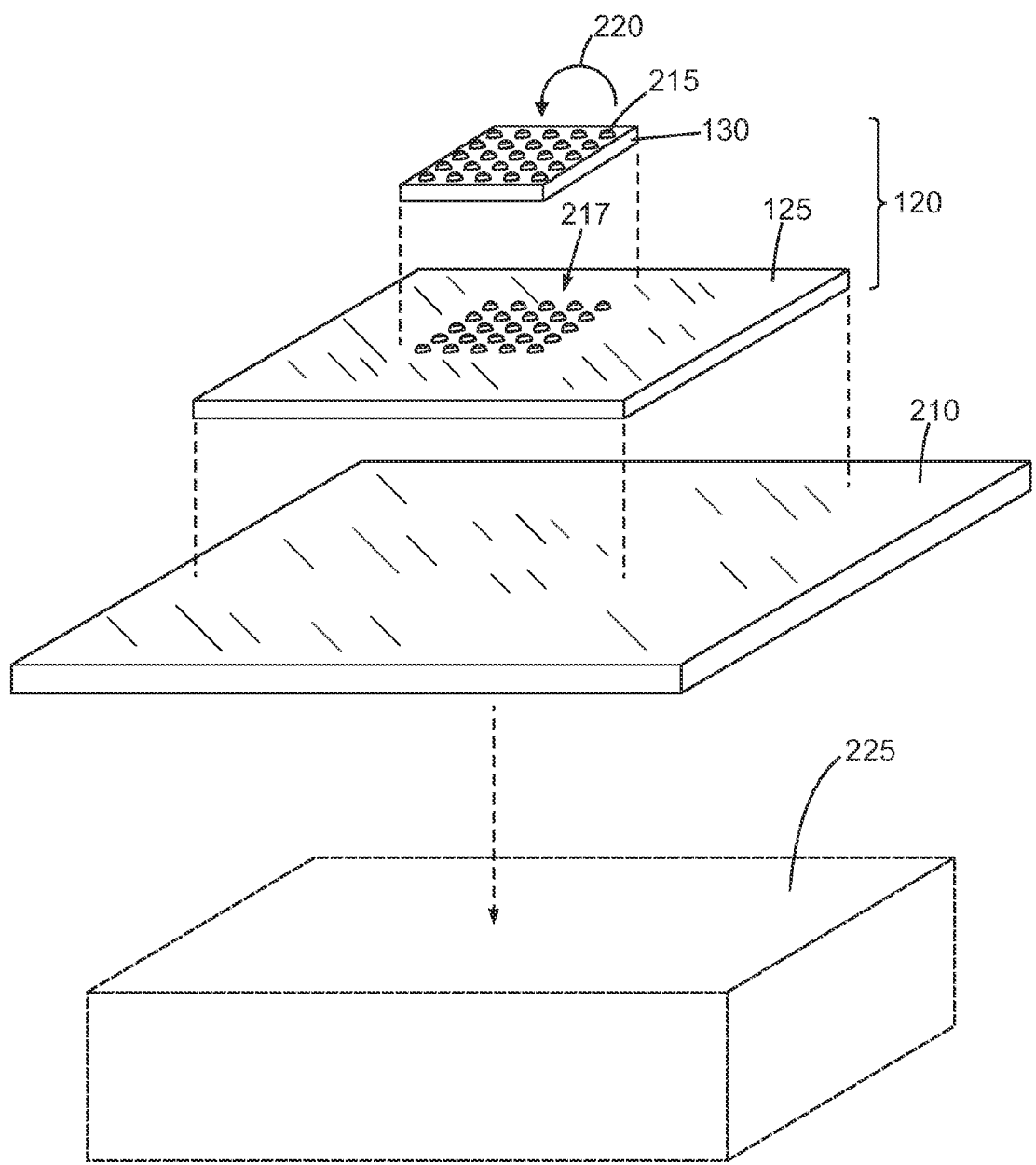
FIG. 7 is an exploded pictorial depicting some possible mounting schemes for any of the package embodiments disclosed herein.

Attention is now turned to FIG. 7, which is an exploded pictorial depicting some possible mounting schemes for any of the package embodiments disclosed herein. In this regard, the package embodiment 120 is shown exploded from another circuit board 210, which may be a motherboard, a daughterboard, or virtually any kind of circuit board to which the package 120 may be mounted. The package 120 includes the aforementioned semiconductor chip 130, which is shown bump side up and includes an array of solder bumps 215 that will join metallurgically to a corresponding array 217 of solder bumps on the package substrate 125 to establish a plurality of solder joints to connect the semiconductor chip 130 and the package substrate 125. Thus, to achieve the mounting shown in FIG. 3, the semiconductor chip 130 is flipped over as indicated by the arrow 220 and flip-chip mounted on the package substrate 125 by way of reflow process. It should be understood that the semiconductor chip 120 may be coupled not only to a package substrate, but to virtually any type of circuit board. The circuit board 210 may be, in turn, mounted to another electronic device 225, which may be a computer, a digital television, a handheld mobile device, a personal computer, a server, a memory device, an add-in board such as a graphics card, or any other computing device employing semiconductors.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   applying a polymeric passivation layer directly to a side of a semiconductor chip that includes plural conductor pads, the polymeric passivation layer covering and extending beyond lateral boundaries of the plural conductor pads;
   forming plural openings in the polymeric passivation layer to expose the plural conductor pads; and
   forming plural conductor structures on the plural conductor pads.

2. The method of claim 1, wherein the applying a polymeric passivation layer comprises applying a monolithic layer.

3. The method of claim 1, wherein the applying a polymeric passivation layer comprises applying a layer of polyimide.

4. The method of claim 1, wherein the forming plural conductor structures comprises forming plural under bump metallization structures on the plural conductor pads.

5. The method of claim 4, comprising forming plural solder structures on the plural under bump metallization structures.

6. The method of claim 1, comprising attaching the side of the semiconductor chip to a printed circuit board.

7. The method of claim 6, comprising coupling the printed circuit board to an electronic device.

8. The method of claim 1, wherein the method is performed by executing instructions stored in a computer readable medium.

9. A method of manufacturing, comprising:
   forming plural conductor pads on a side of a semiconductor chip;
   applying a polymeric passivation layer directly to the side of a semiconductor chip to cover the plural conductor pads;
   forming plural openings in the polymeric passivation layer to expose the plural conductor pads; and
   coupling the side of the semiconductor chip to a printed circuit; and
   establishing plural electrical interconnects between the semiconductor chip and the printed circuit board.

10. The method of claim 9, wherein the applying a polymeric passivation layer comprises applying a monolithic layer.

11. The method of claim 9, wherein the applying a polymeric passivation layer comprises applying a layer of polyimide.

12. The method of claim 9, wherein the forming plural conductor structures comprises forming plural under bump metallization structures on the plural conductor pads.

13. The method of claim 4, wherein printed circuit board comprises plural conductor pads, the establishing plural electrical interconnects comprises forming plural solder joints between the plural under bump metallization structures and the plural conductor pads of the printed circuit board.

14. The method of claim 9, comprising coupling the printed circuit board to an electronic device.

15. A method of manufacturing, comprising:
   providing a semiconductor chip with an external surface that includes plural conductor pads; and
   applying a polymeric passivation layer directly to the external surface, including portions of the external surface positioned beyond lateral boundaries of the plural conductor pads.

16. The method of claim 15, wherein the semiconductor chip comprises part of a semiconductor wafer.

* * * * *